United States Patent
Kobayashi et al.

(10) Patent No.: US 7,704,893 B2
(45) Date of Patent: Apr. 27, 2010

(54) SEMICONDUCTOR DEVICE, METHOD FOR MANUFACTURING SEMICONDUCTOR DEVICE AND GAS FOR PLASMA CVD

(75) Inventors: Yasuo Kobayashi, Nirasaki (JP); Kohei Kawamura, Nirasaki (JP); Tadahiro Ohmi, 1-17-301, Komegafukuro 2-Chome, Aoba-Ku, Sendai-Shi, Miyagi-Ken (JP); Akinobu Teramoto, Sendai (JP); Tatsuya Sugimoto, Tokyo-To (JP); Toshiro Yamada, Tokyo-To (JP); Kimiaki Tanaka, Tokyo-To (JP)

(73) Assignees: Tokyo Eectron Limited, Tokyo (JP); Tadahiro Ohmi, Miyagi-Ken (JP); Zeon Corporation, Tokyo-To (JP)

( * ) Notice: Subject to any disclaimer, the term of this patent is extended or adjusted under 35 U.S.C. 154(b) by 0 days.

(21) Appl. No.: 10/568,461

(22) PCT Filed: Aug. 12, 2004

(86) PCT No.: PCT/JP2004/011595

§ 371 (c)(1),
(2), (4) Date: Feb. 15, 2006

(87) PCT Pub. No.: WO2005/017991

PCT Pub. Date: Feb. 24, 2005

(65) Prior Publication Data
US 2006/0264059 A1  Nov. 23, 2006

(30) Foreign Application Priority Data
Aug. 15, 2003 (JP) ............................. 2003-293739
Aug. 15, 2003 (JP) ............................. 2003-293862
Sep. 3, 2003 (JP) ............................. 2003-311555

(51) Int. Cl.
*H01L 21/31* (2006.01)

(52) U.S. Cl. ............... 438/774; 438/778; 257/E21.274
(58) Field of Classification Search ................. 438/778, 438/786, 623, 774
See application file for complete search history.

(56) References Cited

U.S. PATENT DOCUMENTS 5,661,093 A * 8/1997 Ravi et al. .................. 438/763

(Continued)

FOREIGN PATENT DOCUMENTS

EP  1 186 585  3/2002

(Continued)

OTHER PUBLICATIONS

Notification of Transmittal of Copies of Translation of the International Preliminary Report on Patentability (Form PCT/IB/338)—PCT/JP2004/011595, dated Jan. 2004.

(Continued)

*Primary Examiner*—Walter L Lindsay, Jr.
*Assistant Examiner*—Reema Patel
(74) *Attorney, Agent, or Firm*—Smith, Gambrell & Russell, LLP

(57) ABSTRACT

The present invention relates to a semiconductor device comprising an insulation film consisting of a fluoridation carbon film that has been subjected to thermal history of 420° C. or lower. The feature of the present invention is that an amount of hydrogen atoms included in the fluoridation carbon film is 3 atomic % or less before the fluoridation carbon film is subjected to the thermal history.

5 Claims, 5 Drawing Sheets

U.S. PATENT DOCUMENTS

| | | | |
|---|---|---|---|
| 5,989,998 A | 11/1999 | Sugahara et al. | |
| 6,035,803 A * | 3/2000 | Robles et al. | 118/723 E |
| 6,147,407 A | 11/2000 | Jin et al. | |
| 6,312,766 B1 * | 11/2001 | Pai et al. | 427/523 |
| 6,884,365 B1 * | 4/2005 | Hirayama et al. | 252/79.1 |
| 2002/0004298 A1 | 1/2002 | Sugahara et al. | |
| 2002/0142579 A1 * | 10/2002 | Vincent et al. | 438/623 |
| 2003/0025209 A1 | 2/2003 | Jiwari et al. | |

FOREIGN PATENT DOCUMENTS

| | | |
|---|---|---|
| GB | 2 325 938 | 12/1998 |
| JP | 09-237783 | 9/1997 |
| JP | 10-144675 | 5/1998 |
| JP | 10-284486 | 10/1998 |
| JP | 2000-156375 | 6/2000 |
| JP | 2000-332001 | 11/2000 |
| JP | 2002-220668 | 8/2002 |
| WO | WO99/28963 | 6/1999 |
| WO | 02/22254 | 3/2002 |

OTHER PUBLICATIONS

PCT International Preliminary Report on Patentability (Form PCT/IB/373)—PCT/JP2004/011595, dated Jan. 2004.

Translation of PCT Written Opinion of the International Searching Authority (PCT/ISA/237) dated Jan. 2004.

* cited by examiner

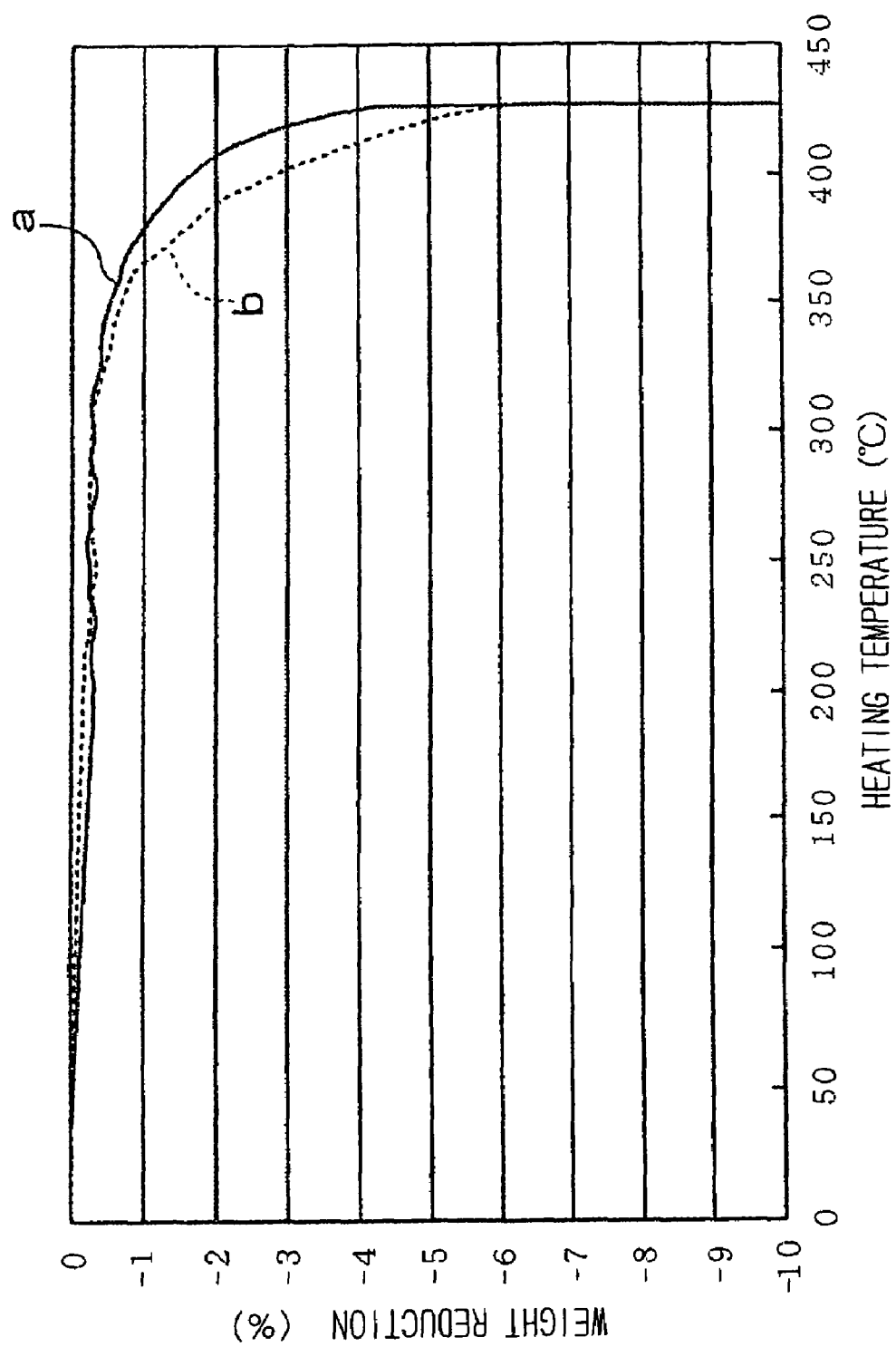
F I G. 6

SEMICONDUCTOR DEVICE, METHOD FOR MANUFACTURING SEMICONDUCTOR DEVICE AND GAS FOR PLASMA CVD

FIELD OF THE INVENTION

This invention relates to a semiconductor device including an insulation film consisting of fluoridation carbon film (fluorocarbon film), such as an interlayer insulation film, and to a manufacturing method of the semiconductor device.

In addition, this invention relates to a gas for a plasma CVD process which is useful in the manufacturing method of the semiconductor device.

BACKGROUND ART

As one way for achieving higher integration of a semiconductor device, there is a technique in which wirings are formed in a multi-layered manner. In order to adopt a multi-layered wiring structure, an n-th wiring layer and an (n+1)-th wiring layer are connected via a conductive layer, and a thin film called an interlayer insulation film is formed at an area except for the conductive layer. As a typical example of the interlayer insulation film, there is known an $SiO_2$ film. However, recently, in order to achieve much higher speed for operation of a device, it has been required to further decrease the dielectric constant of the interlayer insulation film.

In view of such requirement, a fluoridation carbon film that is a chemical compound of carbon (C) and fluorine (F) has been paid attention to. While a dielectric constant of the $SiO_2$ film is around 4, a dielectric constant of the fluoridation carbon film can be not higher than 2 if a kind of source gas is suitably selected. Thus, the fluoridation carbon film is a much effective film as an interlayer insulation film. Various gases are known as a source gas for the fluoridation carbon film (Japanese Patent Laid-Open Publication No. 144675/1998: section 0017). For example, a $C_5F_8$ (octafluorocyclopentene) gas is a superior source gas because it can form a film having a network structure.

In addition, as a conventional art relating to the source gas for the fluoridation carbon, there is known a technique disclosed in Japanese Patent Laid-Open Publication No. 237783/1997. According to the technique, hexafluoro-1,3-butadiene or hexafluoro-2-butyne is used as a source gas, and an insulation film consisting of a fluorinated amorphous carbon is formed by means of a plasma CVD method, so that a dielectric constant of 2.1 or 2.5 can be respectively obtained.

According to Japanese Patent Laid-Open Publication No. 220668/2002, various unsaturated carbon fluorides are used as a film-forming gas, and film density and film surface roughness are studied.

According to Japanese Patent Laid-Open Publication No. 332001/2000, by means of a plasma CVD method using a high-purity octafluorocyclopentene, a film having a dielectric constant of 2.4 can be obtained.

SUMMARY OF THE INVENTION

In the source gas for the fluoridation carbon film, a small amount of hydrogen is included, for example, atomic % in the $10^{-2}$ order of hydrogen is included. Herein, the atomic % in the source gas means a value calculated considering $C_5F_8$ as an atom. The small amount of hydrogen may be thought to be hydrogen that has mainly formed water left in the source gas without completely removed.

On the other hand, when the fluoridation carbon film is formed by using the $C_5F_8$ gas including the small amount of hydrogen, an amount of hydrogen included in the film is 5 atomic %, for example. That is, although the amount of hydrogen included in the source gas is very small, the amount of hydrogen included in the film is not so small. The reason is thought that an atom of the hydrogen in the source gas may selectively combine with dangling-bond of the fluorine in the film.

However, when the hydrogen is included in the fluoridation carbon film, the hydrogen may bond the fluorine to generate hydrogen fluoride. Then, when it is heated to 350° C. or higher, for example, during a manufacturing step of a device, the hydrogen fluoride may go off from the film. As a result, weight reduction of the fluoridation carbon film may be caused. That is, if hydrogen is included in the source gas, the fluoridation carbon film may be inferior in thermal stability. Then, if degassing is caused during a heating step, the film may be cavitated to become weaker, so that adhesion is deteriorated, holding action of the wirings by the interlayer insulation film is also deteriorated, and winding of the wirings and/or electro-migration may be generated more easily. In addition, there is a fear that the wirings may be corroded by the hydrogen fluoride.

This invention is intended to solve the above problems. The object of this invention is to provide a semiconductor device including an insulating film consisting of a good fluoridation carbon film. In addition, the object of the invention is to provide a manufacturing method of a semiconductor device that can form an insulation film superior in thermal stability, in forming an insulating film consisting of a fluoridation carbon film by using a source gas consisting of a chemical compound of carbon and fluorine.

A semiconductor device of the present invention comprises an insulation film consisting of a fluoridation carbon film that has been subjected to thermal history of 420° C. or lower, for example 350° C. to 420° C., wherein an amount of hydrogen atoms included in the fluoridation carbon film is 3 atomic % or less before the fluoridation carbon film is subjected to the thermal history. The insulation film is an interlayer insulation film, for example.

In general, if hydrogen atoms are included in the fluoridation carbon film, the hydrogen and the fluorine may react on each other to become hydrogen fluoride and to go off from the film (to cause degassing), during a heating step conducted afterward. However, according to the invention, since the amount of hydrogen atoms included in the fluoridation carbon film is 3 atomic % or less before the fluoridation carbon film is subjected to the thermal history of 420° C. or lower, such as thermal history of 350° C. to 420° C., weight reduction of the fluoridation carbon film when the fluoridation carbon film is subjected to the thermal history may be restrained. Thus, functional deterioration of the fluoridation carbon film as an insulation film may be restrained.

In addition, the invention is a manufacturing method of a semiconductor device comprising the steps of: generating a plasma of a source gas consisting of a chemical compound of carbon and fluorine and including hydrogen atoms of $1 \times 10^{-3}$ atomic % or less; and forming an insulating film consisting of a fluoridation carbon film that includes hydrogen atoms of 3 atomic % or less, on a substrate, by using the plasma of the source gas.

According to the above feature, since the source gas consisting of a chemical compound of carbon and fluorine and including hydrogen atoms of $1 \times 10^{-3}$ atomic % or less is used, it is possible to obtain the insulating film consisting of a fluoridation carbon film that includes hydrogen atoms of 3 atomic % or less.

Herein, the amount represented by the unit of atomic % regarding the hydrogen atoms in the source gas means an amount calculated by considering the chemical compound of carbon and fluorine as one atom. Even if the other atoms such as oxygen atoms are included in the source gas besides the hydrogen atoms, since the amount of such impurities (the other atoms) is very small, the amount represented by the above unit, which means a ratio of the number of hydrogen atoms with respect to the number of molecules of the chemical compound, is used.

On the other hand, the unit of atomic % regarding the hydrogen atoms in the insulation film means an amount representing a ratio of the hydrogen atoms with respect to the total number of the respective atoms, for example the total number of the carbon atoms, the fluorine atoms and the hydrogen atoms.

Preferably, the manufacturing method of a semiconductor device further comprises a step of heating the substrate at a temperature of 420° C. or lower, for example a temperature of 350° C. to 420° C., after the step of forming the insulating film.

In addition, for example, the chemical compound of carbon and fluorine is $C_5F_8$.

On the other hand, by means of a method using a conventional gas for a CVD process, it was impossible to obtain an interlayer insulation film having a small dielectric constant, which has a sufficient effect on reduction of capacity between wirings in a highly-integrated semiconductor device.

The object of the present invention is to provide a gas for a plasma CVD process, used for manufacturing an interlayer insulation film having a small dielectric constant.

The inventors studied and studied to achieve the above object. Finally, they have found that the amount of a chemical compound including a hydrogen atom in a gas for a plasma CVD process has a great effect on characteristics of a film formed by the plasma CVD process, and that generation of a corrosion gas during a heating process of the formed film is restrained if the amount of a chemical compound including a hydrogen atom in a gas for a plasma CVD process is restrained, so that the present invention was completed.

Then, the present invention provides a gas for a plasma CVD process containing an unsaturated carbon fluoride compound and a chemical compound including a hydrogen atom, the amount of the chemical compound including a hydrogen atom being 90 weight ppm or less.

Herein, it is preferable that the gas for a plasma CVD process further contains water in the amount of 3 weight ppm or less.

Especially, it is preferable that the unsaturated carbon fluoride compound is octafluorocyclopentene, octafluoro-2-pentyne, or hexafluoro-1,3-butadiene.

In addition, it is preferable to manufacture the gas for a plasma CVD process by bringing a composition of the unsaturated carbon fluoride compound and the chemical compound including a hydrogen atom in contact with burned adsorbent.

In addition, the present invention provides a forming method of an insulation film comprising the step of conducting a plasma CVD process by using the above gas.

When the gas for a plasma CVD process according to the present invention is used to conduct the plasma CVD process, it is possible to reproducibly form an interlayer insulation film having a small dielectric constant, which has a sufficient effect on reduction of capacity between wirings of a highly-integrated semiconductor device, and it is also possible to obtain a remarkable effect that no corrosion gas is generated even when a semiconductor tip having the interlayer insulation film formed by using the gas for a plasma CVD process is subjected to a heating process during manufacturing step of a semiconductor device.

BRIEF DESCRIPTION OF THE DRAWINGS

FIG. 6 is a graph comparing relationships between heating temperatures of the fluoridation carbon film and weight reduction thereof based on difference of the amount of hydrogen in a source gas.

DESCRIPTION OF THE PREFERRED EMBODIMENT

A manufacturing method of a semiconductor device according to the invention includes a step of forming an insulation film consisting of a fluoridation carbon film (CF film). An embodiment is explained, wherein an interlayer insulation film is formed as an insulation film.

Figure 1:
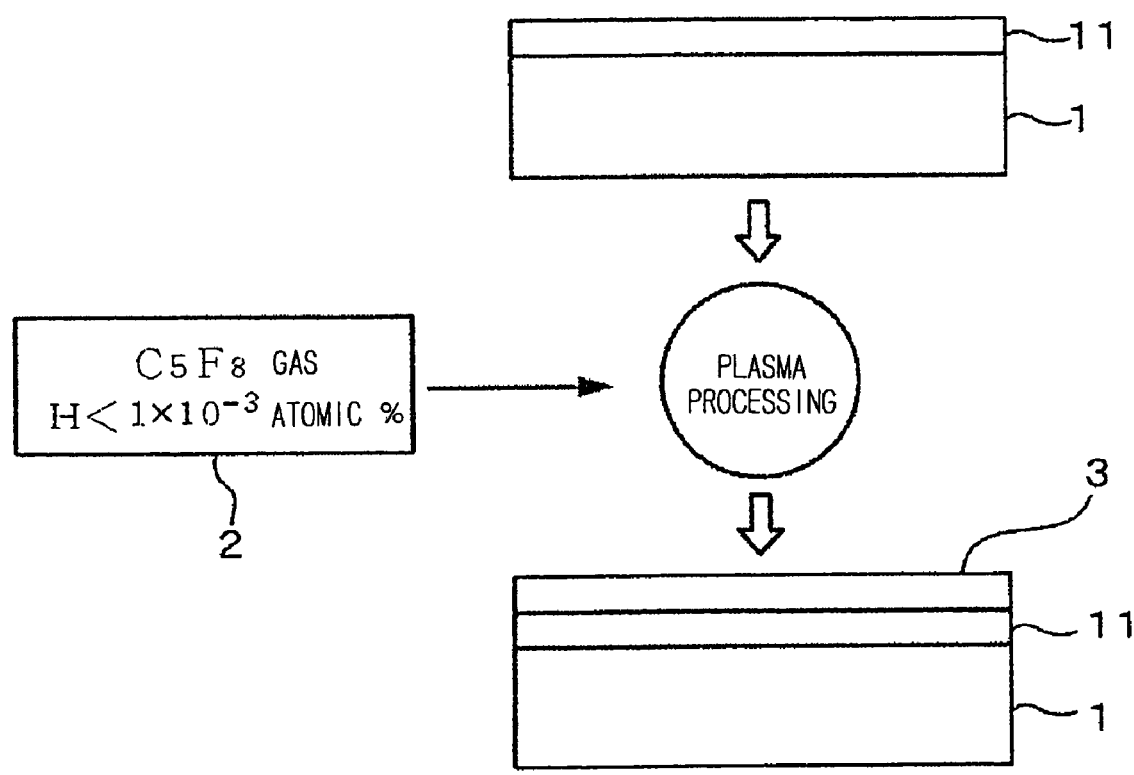
FIG. 1 is an explanatory view showing a state wherein a fluoridation carbon film is formed according to an embodiment of the present invention.

FIG. 1 is a view showing an image of the embodiment. As a substrate 1, a substrate for forming an integrated circuit, for example including a CMOS, is used. For example, a substrate is used wherein a BPSG film 11 has been formed on a surface thereof. The BPSG film 11 means a silicate glass film into which boron (B) and phosphorus (P) have been doped. Instead of the BPSG film 11, a silicon oxide film may be used, which may be formed from TEOS as a source.

As a source gas 2, a chemical compound of carbon and fluorine such as $C_5F_8$ is used. It is necessary that the amount of hydrogen atoms included in the $C_5F_8$ gas is $1\times10^{-3}$ atomic % or less.

When the $C_5F_8$ gas is made into a plasma, active species of the chemical compound of carbon and fluorine included in the plasma are deposited on a surface of the substrate 1, so that a fluoridation carbon film 3 is deposited. At that time, the hydrogen included in the source gas is captured in the fluoridation carbon film 3. As described above, the hydrogen atoms selectively combine with dangling-bond of fluorine atoms in the fluoridation carbon film 3. Thus, the amount of the hydrogen captured in the fluoridation carbon film 3 becomes larger than a content ratio thereof in the source gas.

If the $C_5F_8$ gas including the hydrogen atoms of $1\times10^{-3}$ atomic % or less is used to conduct a plasma process as described below, it is possible to restrain the amount of the hydrogen captured in the fluoridation carbon film 3 to 3 atomic % or less. The value is based on examples, which are described below. The amount of the hydrogen atoms included in the source gas is obtained by a calculation from a measured value of water content included in the source gas. In direct definition by the water content, the water content included in the source gas is preferably 0.5 weight ppm or less (then, a calculated value of the hydrogen atoms included in the source gas is $1.17\times10^{-3}$ atomic % or less), more preferably 0.1 weight ppm or less.

Figure 2:
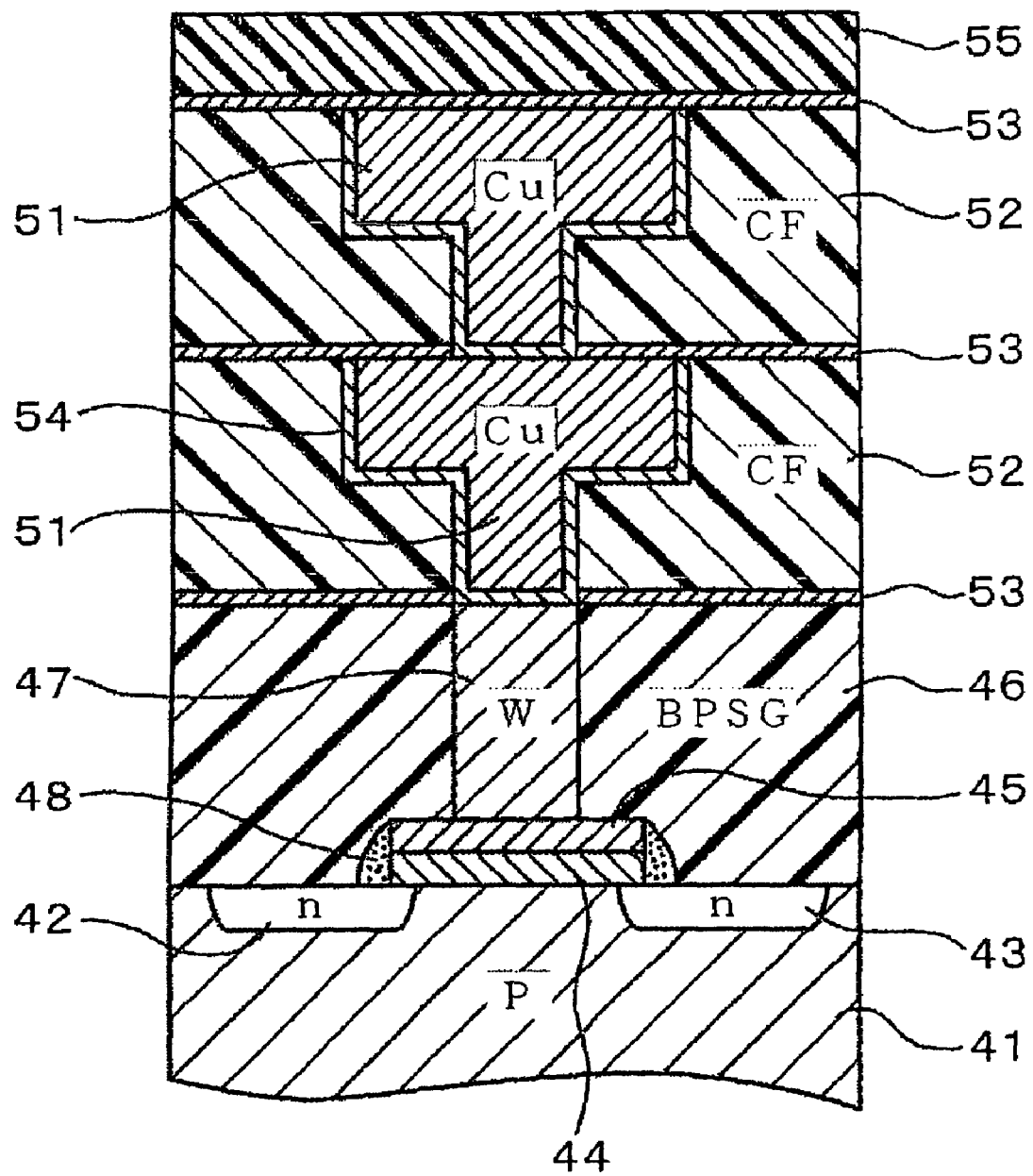
FIG. 2 is a sectional view showing a semiconductor device manufactured by the embodiment of the present invention.

FIG. 2 is an example of a semiconductor device including an interlayer insulation film, which has been formed as described above. 41 represents a p-type silicon layer, 42 and 43 represent n-type portions respectively serving as a source and a drain, 44 represents a gate oxide film and 45 represents a gate electrode. A MOS transistor is formed by these elements. In addition, 46 represents a BPSG film, 47 represents a wiring made of, for example, tungsten (W), and 48 represents a side spacer. A plurality of interlayer insulation films 52 (two films in FIG. 2 for the convenience) is layered in a multi-layered structure on the BPSG film 46, a wiring layer 52 made of, for example, copper having been buried in each interlayer insulation film 52. Herein, 53 represents a hard mask made of, for example, silicon nitride, 54 represents a protection layer made of, for example, a titanium nitride or a tantalum nitride, for preventing diffusion of the wiring metal, and 55 represents a protection film.

The manufacturing process of the semiconductor device includes a step of heating the substrate. Thus, the interlayer insulation films 52 are heated to a process temperature of the heating step. As an example of the heating step, a film-forming step of an insulation film, an annealing step of the copper wiring, or an annealing step of the hard mask made of for example tantalum nitride, may be cited. The highest process temperature among the heating steps after the interlayer insulation films 52 are formed is in general 350° C. to 420° C. However, this invention is also applicable to a case wherein a heat treatment temperature after a fluoridation carbon film is formed is 250° C. to 350° C., or 200° C. to 300° C.

The hydrogen included in the interlayer insulation films 52 consisting of the fluoridation carbon films may bond fluorine to become hydrogen fluoride (HF) and go off from the films, when the films are heated. As a result, the films are cavitated and weakened. However, it has been found that: when the highest temperature of the heating steps (i.e., thermal history of the interlayer insulation films 52) is within the above temperature range, if the amount of the hydrogen included in the films is 3 atomic % or less, only a smaller amount of the hydrogen fluoride may go off form the films, so that the films are superior in thermal stability.

Figure 3:
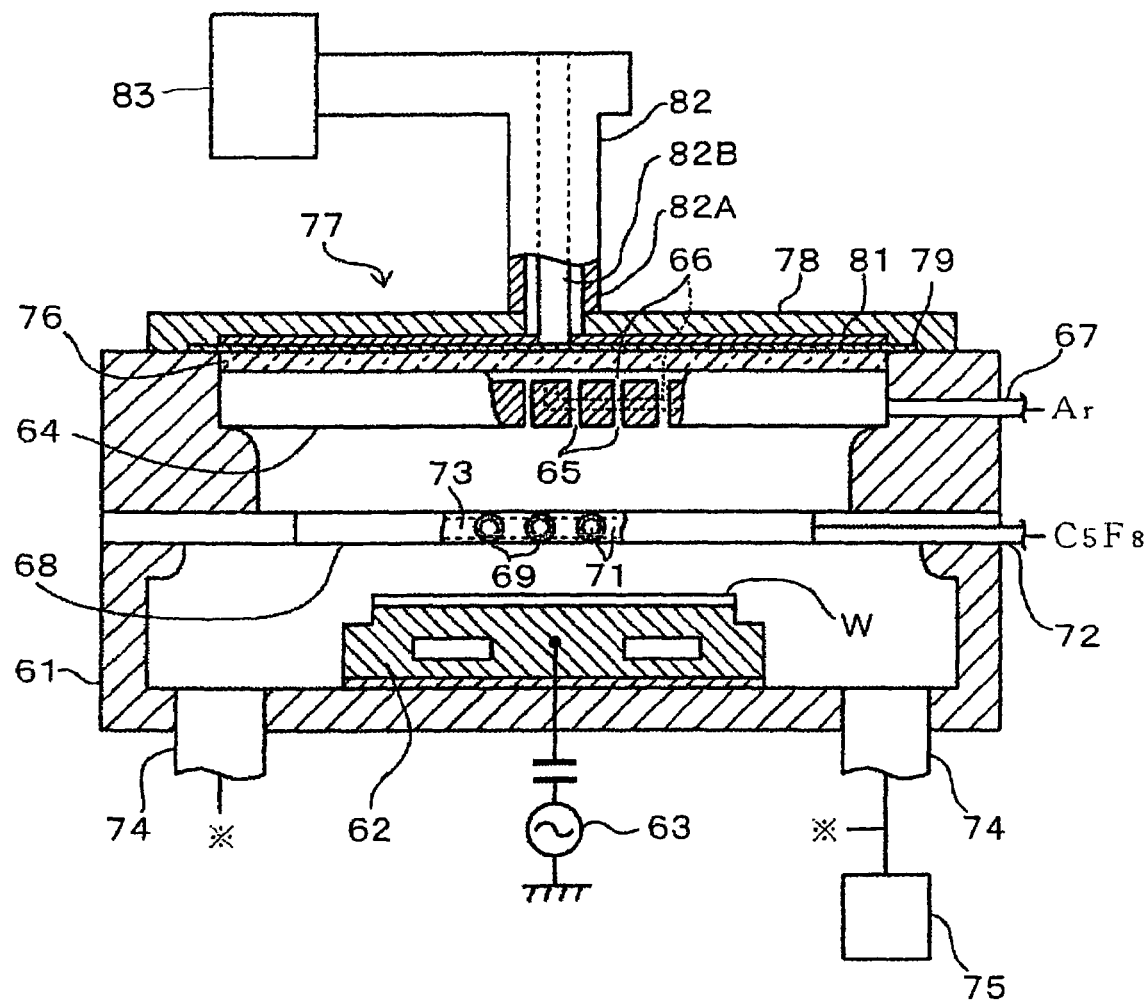
FIG. 3 is a longitudinal side view showing an example of a plasma film-forming apparatus used for the embodiment of the present invention, together with a partial sectional view thereof.
Figure 4:
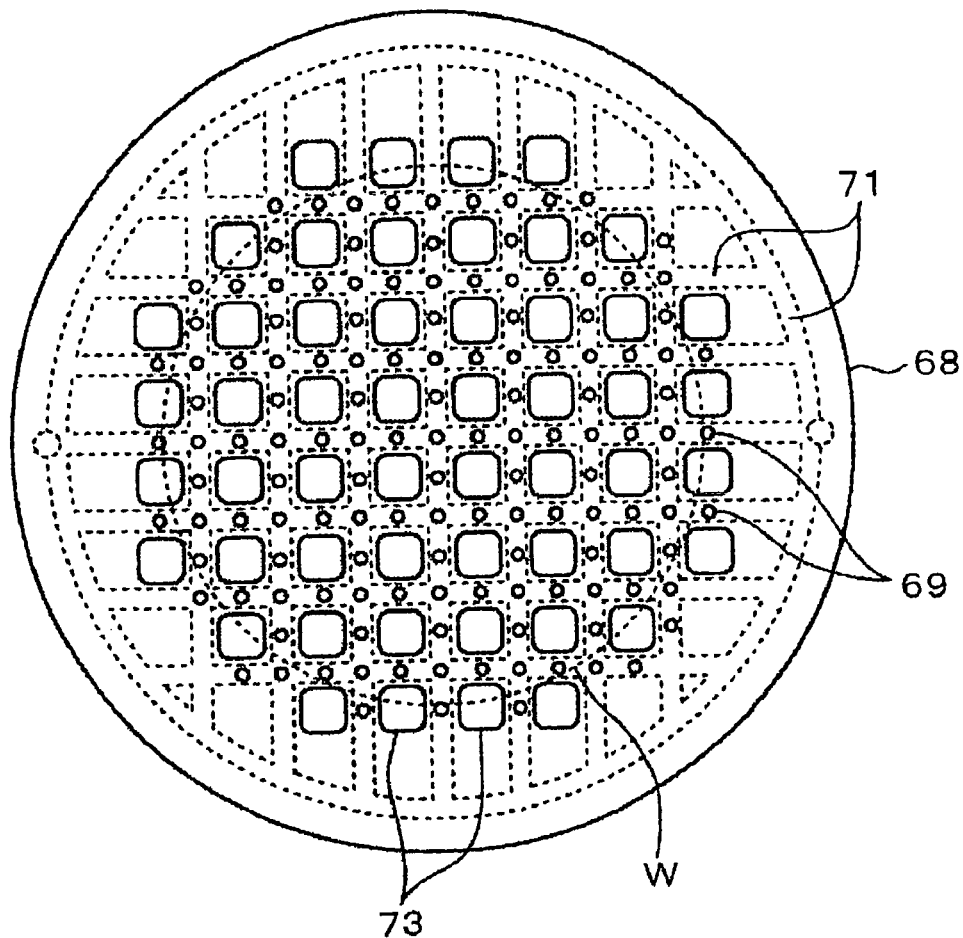
FIG. 4 is a plan view showing a second gas-supplying part of the plasma film-forming apparatus of FIG. 3.
Figure 5:
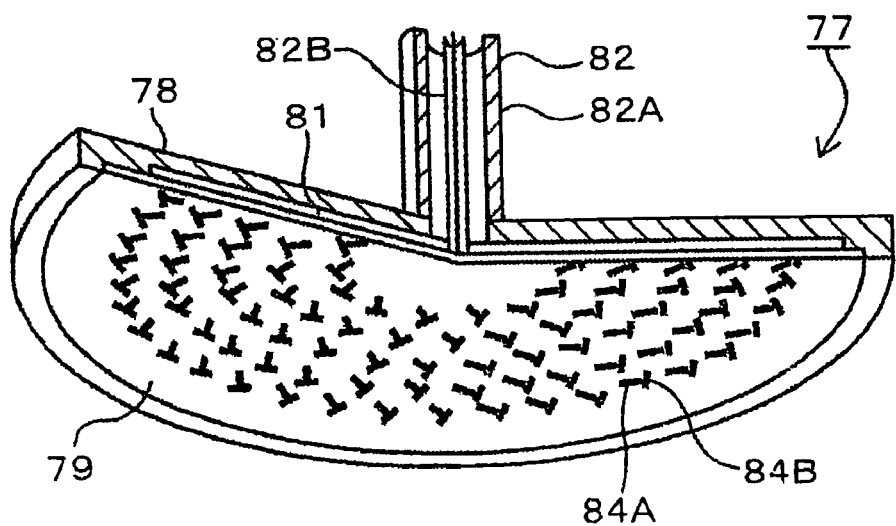
FIG. 5 is a perspective view showing an antenna part of the plasma film-forming apparatus of FIG. 3, together with a partial sectional view thereof.

Next, a plasma film-forming apparatus that forms an interlayer insulation film by using a $C_5F_8$ gas including hydrogen atoms of $1\times10^{-3}$ atomic % or less as a source gas is simply explained with reference to FIGS. 3 to 5. In the drawings, 61 represents a processing container (vacuum chamber), and 62 represents a stage including a temperature-adjusting means. The stage 62 is connected to a radio-frequency electric power source 63 of 13.56 MHz for imparting a bias, for example.

In an upper portion of the processing container 61, a first gas-supplying part 64, for example made of alumina, for example having a substantially cylindrical shape, is provided opposite to the stage 62. Many first gas-supplying holes 65 are formed at a surface opposite to the stage 62 of the first gas-supplying part 64. The gas-supplying holes 65 communicate with a first gas-supplying channel 67 via a gas flow channel 66. The first gas-supplying channel 67 is connected to a supplying source of an argon (Ar) gas or a krypton (Kr) gas, which is a plasma gas.

A second gas-supplying part 68 consisting of an electric conductor and having for example a substantially disk shape is provided between the stage 62 and the first gas-supplying part 64. Many second gas-supplying holes 69 are formed at a surface opposite to the stage 62 of the second gas-supplying part 68. For example, as shown in FIG. 4, a lattice-like gas flow channel 71 communicating with the gas-supplying holes 69 is formed inside the second gas-supplying part 68. The gas flow channel 71 is connected with the second gas-supplying channel 72. Many openings 73 vertically piercing the gas-supplying part 68 are formed in the second gas-supplying part 68. The openings 73 are formed between adjacent portions of the gas flow channel 71 in order to allow plasma to enter a space under the second gas-supplying part 68, as shown in FIG. 4, for example.

Herein, the second gas-supplying part 68 is connected to a supplying source of the $C_5F_8$ gas as a source gas (not shown) via the second gas-supplying channel 72. Thus, the source gas flows into the gas flow channel 71 via the second gas-supplying channel 72, and is uniformly supplied into the space under the second gas-supplying part 68 via the gas-supplying holes 69. In addition, 74 represents a gas-discharging pipe, which is connected to a vacuuming means 75.

A cover plate 76 consisting of a dielectric material such as alumina is provided at an upper portion of the first gas-supplying part 64. An antenna part 77 is provided on the cover plate 76 in such a manner that the antenna part 77 is in close contact with the cover plate 76. As shown in FIG. 5, the antenna part 77 comprises: a circular and flat antenna main body 78 having a lower opening, and a disk-like plane antenna member (slit plate) 79 provided to close the lower opening of the antenna main body 78 and having many slits. The antenna main body 78 and the plane antenna member 79 are made of an electric conductor, and form a flat and hollow circular waveguide.

A retardation plate 81 consisting of a low-loss dielectric material such as alumina, silicon oxide or silicon nitride is provided between the plane antenna member 79 and the antenna main body 78. The retardation plate 81 shortens a wavelength of a microwave, which is described below, in order to shorten a guide wavelength in the circular waveguide. In this embodiment, the antenna main body 78, the plane antenna member 79 and the retardation plate 81 form a radial-line-slit antenna.

In the above antenna part 77, the plane antenna member 79 is mounted on the processing container 61 via a sealing member not shown in such a manner that the plane antenna member 79 is in close contact with the cover plate 76. Then, the antenna part 77 is connected to an outside microwave generating unit 83 via a coaxial waveguide 82. Thus, for example, a microwave whose frequency is 2.45 GHz or 84 GHz is supplied thereto. At that time, an outside waveguide 82A of the coaxial waveguide 82 is connected to the antenna main body 78, and a central conductor 82B is connected to the plane antenna member 79 via an opening formed at the retardation plate 81.

For example, the plane antenna member 79 consists of a copper plate having a thickness of about 1 mm. As shown in FIG. 5, many slits 84 for generating a circularly polarized wave, for example, are formed at the plane antenna member 79. Specifically, a plurality of pairs of slits 84A and 84B arranged in a substantially T-like shape with a slight gap is formed in a circumferential direction forming a concentric-circle pattern or a spiral pattern or the like. The slits may be arranged in a substantially V-like shape with a slight gap in each pair. The slits 84A and 84B are arranged in such a relationship that the slits 84A and 84B are substantially perpendicular to each other. Thus, a circularly polarized wave including two perpendicular polarized wave components is radiated. If the pairs of the slits 84A and 84B are arranged according to a gap corresponding to a wavelength of the microwave shortened by the retardation plate 81, the microwave is radiated from the plane antenna member 79 as a substantially plane wave.

Next, an example of film-forming process carried out by the above film-forming apparatus is explained. At first, a wafer W as a substrate is conveyed and placed on the stage 62. Then, the inside of the processing container 61 is vacuumed to a predetermined pressure, the plasma gas such as an Ar gas is supplied into the first gas-supplying part 64 via the first gas-supplying channel 67 at a predetermined flow rate such as 300 sccm, and the source gas such as a $C_5F_8$ gas is supplied into the second gas-supplying part 68 via the second gas-supplying channel 72 at a predetermined flow rate such as 150 sccm. Then, the inside of the processing container 61 is maintained at a process pressure of 13.3 Pa, and a surface temperature of the stage 62 is set at 350° C.

On the other hand, a radiofrequency wave (microwave) of 2.45 GHz, 2000 W is supplied from the microwave generating unit 83. The microwave is transmitted in the coaxial waveguide 82 (in the central conductor 82B) in a TM mode, a TE mode or a TEM mode to the plane antenna member 79 of the antenna part 77. Then, while the microwave is transmitted radially from a central portion of the plane antenna member 79 to a peripheral area thereof, the microwave is radiated from the pairs of the slits 84A and 84B toward the processing space under the gas-supplying part 64 via the cover plate 76 and the first gas-supplying part 64.

Then, because of the above arrangement of the pairs of the slits 84A and 84B, a circularly polarized wave is uniformly radiated over the surface of the plane antenna member 79, so that density of electric field in the space under the plane antenna member 79 is made uniform. Then, by the energy of the microwave, uniform plasma with high density, for example of an Ar gas, is generated in the space between the first gas-supplying part 64 and the second gas-supplying part 68. On the other hand, the $C_5F_8$ gas ejected from the second gas-supplying part 68 flows into an upper space through the openings 73. Active species generated from the $C_5F_8$ gas that has been activated by contact with the plasma descend into the film-forming space under the second gas-supplying part 68 via the openings 73, and deposit on a surface of the wafer W. Thus, an interlayer insulation film consisting of a fluoridation carbon film is formed. That is, according to the plasma processing apparatus, the film-forming space wherein the active species exist (but no irradiation exists) is formed under the plasma space, so that the fluoridation carbon film is formed by so-called "soft" active species. Thus, a dense thin film with high adhesion and high thermal stability can be obtained.

In the above example, the interlayer insulation film is cited as an example. However, any other insulation film than the interlayer insulation film may be adopted. In addition, as a source gas, not limited to the $C_5F_8$ gas, a $CF_4$ gas, a $C_2F_6$ gas, a $C_3F_8$ gas, a $C_3F_9$ gas, a $C_4F_8$ gas or the like may be used. The ratio (F/C) between fluorine (F) and carbon (C) in the source gas is preferably 1 to 4, more preferably 1 to 2. In addition, when the ratio F/C in the fluoridation carbon film is smaller than 0.1, the fluoridation carbon film may have electrostatic property. When the ratio F/C in the fluoridation carbon film is larger than 1.5, adhesion of the fluoridation carbon film may be deteriorated. Thus, the ratio F/C is preferably 0.1 to 1.5, more preferably 0.1 to 0.7.

Example 1

A fluoridation carbon film having a thickness of 500 nm was formed on two bare silicon substrates by conducting a plasma process by means of the above plasma film-forming apparatus, by using the $C_5F_8$ gas as a source gas including hydrogen of $1.17 \times 10^{-3}$ atomic %. The amount of the hydrogen included in the source gas is a value calculated from an amount of water included therein. The amount of the water was obtained by a mass analysis, and the value was 0.5 weight ppm. The process conditions such as the flow rate or the electric power were the values as described above.

Then, one silicon substrate was heated in a vacuumed container at a temperature rise rate of 10° C./min and a weight of the silicon substrate was measured by an electronic balance, so that weight reduction at respective temperatures in a range from a room temperature to 425° C. was obtained. The result is shown in FIG. 6 by a solid line a.

In addition, hydrogen density in the fluoridation carbon film of the other silicon substrate was measured. The result was 3 atomic %. The measurement of the hydrogen density was conducted by a Rutherford scattering spectroscopy. Herein, as described above, the atomic % in the source gas means the value calculated considering the $C_5F_8$ as an atom (without dissoluting the $C_5F_8$ into C and F). The ratio of the $C_5F_8$ is about 100%. Thus, for example, if a very small amount of oxygen is included in the source gas, the hydrogen density can be deemed a ratio of the number of hydrogen atoms with respect to the number of $C_5F_8$ molecules (the number of assumptive atoms).

On the other hand, the atomic % in the fluoridation carbon film is represented by {the number of hydrogen atoms/(the number of hydrogen atoms+the number of carbon atoms+the number of fluorine atoms)}×100.

(Comparison 1)

A fluoridation carbon film having a thickness of 500 nm was formed on two bare silicon substrates in the same manner as the example 1 except for by using the $C_5F_8$ gas as a source gas including hydrogen of $15.2 \times 10^{-3}$ atomic %. The same experiment as the example 1 was conducted, so that weight reduction was examined. The amount of hydrogen included in the source gas was a value calculated from the amount of water included therein. The amount of water included therein was 6.5 weight ppm. The result is shown in FIG. 6 by a solid line b.

In addition, hydrogen density in the fluoridation carbon film of the other silicon substrate was examined. The result was 5 atomic %.

(Consideration)

As shown in FIG. 6, from the room temperature to about 350° C., the weight reduction was scarcely found in both the fluoridation carbon films of the example 1 and the comparison 1. However, at a temperature higher than 350° C., the weight reduction was remarkable in the film of the comparison 1. On the other hand, in the film of the example 1, the degree of the weight reduction was small at a temperature lower than about 380° C. However, over about 380° C., the weight reduction was remarkable. However, at a temperature lower than about 420° C., the degree of the weight reduction was smaller in the film of the example 1 than in the film of the comparison 1. In addition, at a temperature higher than 425° C., the degree of the weight reduction was large, over 10%, in both the films.

That is, when a fluoridation carbon film is subjected to a thermal history of 350° C. to 420° C., i.e., when a heating step of heating the fluoridation carbon film to the temperature range is included after the fluoridation carbon film has been formed, the degree of the weight reduction was smaller in the film of the example 1 than in the film of the comparison 1. This means that it is possible to raise the process temperature of the heating step even if the weight reduction has to be restrained under a certain value. In order to obtain a good thin film in a subsequent film-forming step, or in order to improve throughput by shortening the process time, it may often advantageous to raise the process temperature. Thus, raising the process temperature is advantageous in a semiconductor manufacturing step.

As described above, the degree of the weight reduction is smaller in the fluoridation carbon film including the hydrogen whose density is 3 atomic % than in the fluoridation carbon film including the hydrogen whose density is 5 atomic %. The reason is thought that only a small amount of hydrogen fluoride formed by bonding hydrogen and fluorine in the film goes off from the film. That is, the degassing amount is small. Thus, it is prevented that the film is cavitated, and generation of winding of the wirings and/or generation of electro-migration may be reduced. In addition, it is also prevented that the wirings are corroded by the hydrogen fluoride. Thus, the yield is improved.

If the hydrogen density in the fluoridation carbon film is not higher than 3.0 atomic % taking into consideration some margin, it is possible to obtain the above effect sufficiently. For that purpose, it was confirmed that it is necessary for the source gas to consist of a chemical compound of carbon and fluorine and to include hydrogen atoms of $1 \times 10^{-3}$ atomic % or less.

Next, an embodiment of the gas for a plasma CVD process according to the present invention is explained in detail. The gas for a plasma CVD process according to the present invention contains an unsaturated carbon fluoride compound and a chemical compound including a hydrogen atom, the amount of the chemical compound including a hydrogen atom being 90 weight ppm or less.

The unsaturated carbon fluoride compound used for the gas for a plasma CVD process according to the present invention consists of only carbon atoms and fluorine atoms, and has a double or triple bond. The carbon number is preferably 2 to 7, more preferably 2 to 5, further more preferably 4 to 5, the most preferably 5. Concrete examples of the unsaturated carbon fluoride compound are: an unsaturated carbon fluoride compound whose carbon number is 2, such as tetrafluoroethylene; an unsaturated carbon fluoride compound whose carbon number is 3, such as hexafluoropropene, tetrafluoropropyne, or tetrafluorocyclopropene; an unsaturated carbon fluoride compound whose carbon number is 4, such as hexafluoro-2-butyne, hexafluoro-1-butyne, hexafluorocyclobutene, hexafluoro-1,3-butadiene, hexafluoro-(1-methylcyclopropene), octafluoro-1-butene, or octafluoro-2-butene; an unsaturated carbon fluoride compound whose carbon number is 5, such as octafluoro-1-pentyne, octafluoro-2-pentyne, octafluoro-1,3-pentadiene, octafluoro-1,4-pentadiene, octafluorocyclopentene, octafluoroisoprene, hexafluorovinylacetylene, octafluoro-(1-methylcyclobutene), or octafluoro-(1,2-dimethylcyclopropene); a chemical compound of an unsaturated carbon fluoride whose carbon number is 6, such as dodecafluoro-1-hexene, dodecafluoro-2-hexene, dodecafluoro-3-hexene, decafluoro-1,3-hexadiene, decafluoro-1,4-hexadiene, decafluoro-1,5-hexadiene, decafluoro-2,4-hexadiene, decafluorocyclohexene, hexafluorobenzene, octafluoro-2-hexyne, octafluoro-3-hexyne, octafluorocyclo-1,3-hexadiene, or octafluorocyclo-1,4-hexadiene; an unsaturated carbon fluoride compound whose carbon number is 7, such as undecafluoro-1-heptene, undecafluoro-2-heptene, undecafluoro-3-heptene, or dodecafluorocycloheptene. The preferable one is: tetrafluoroethylene, hexafluoropropene, tetrafluoropropyne, tetrafluorocyclopropene, hexafluoro-2-butyne, hexafluoro-1-butyne, hexafluorocyclobutene, hexafluoro-1,3-butadiene, hexafluoro-(1-methylcyclopropene), octafluoro-1-butene, octafluoro-2-butene, octafluoro-1-pentyne, octafluoro-2-pentyne, octafluoro-1,3-pentadiene, octafluoro-1,4-pentadiene, octafluorocyclopentene, octafluoroisoprene, hexafluorovinylacetylene, octafluoro-1-methylcyclobutene or octafluoro-1,2-dimethylcyclopropene. The more preferable one is: hexafluoro-2-butyne, hexafluoro-1-butyne, hexafluorocyclobutene, hexafluoro-1,3-butadiene, hexafluoro-(1-methylcyclopropene), octafluoro-1-butene, octafluoro-2-butene, octafluoro-1-pentyne, octafluoro-2-pentyne, octafluoro-1,3-pentadiene, octafluoro-1,4-pentadiene, octafluorocyclopentene, octafluoroisoprene, hexafluorovinylacetylene, octafluoro-(1-methylcyclobutene) or octafluoro-(1,2-dimethylcyclopropene). The further more preferable one is octafluoro-2-pentyne, octafluoro-1,3-pentadiene or octafluorocyclopentene. The further more preferable one is octafluoro-2-pentyne or octafluorocyclopentene. The most preferable one is octafluoro-2-pentyne.

The gas for a plasma CVD process according to the present invention contains the unsaturated carbon fluoride compound in the amount of usually 90 weight % or higher, preferably 95 weight % or higher, more preferably 99 weight % or higher, further more preferably 99.9 weight % or higher. Herein, the gas for a plasma CVD process according to the present invention can contain another kind of gas for the plasma CVD process and/or a diluent gas as far as the object of the present invention is not disturbed. However, it is preferable that the gas for a plasma CVD process doesn't include any other component than the unsaturated carbon fluoride compound.

Regarding the present invention, the chemical compound including a hydrogen atom means an organic compound including a hydrogen atom and an inorganic compound including a hydrogen atom such as water, which exist in the gas for a plasma CVD process.

In the gas for a plasma CVD process according to the present invention, the amount of the chemical compound including a hydrogen atom is 90 weight ppm or less, preferably 70 weight ppm or less, more preferably 50 weight ppm or less, and further more preferably 10 weight ppm or less. In addition, in the gas for a plasma CVD process according to the present invention, the amount of the water is preferably 3 weight ppm or less, more preferably 1 weight ppm or less, and further more preferably 0.5 weight ppm or less. In a concrete example, when a gas for a plasma CVD process containing hydrogen atoms in the amount of $1 \times 10^{-3}$ atomic % or less was used, the amount of hydrogen in a formed film could be restrained to 3 atomic % or less. In the case, the amount of the chemical compound including a hydrogen atom in the gas for a plasma CVD process corresponds to the amount of water of 0.5 weight ppm (the calculated value of the amount of the included hydrogen atoms is $1.17 \times 10^{-3}$ atomic %). Thus, it was conformed that the amount of water in the gas for a plasma CVD process is preferably 0.5 weight ppm or lower, more preferably 0.1 weight ppm or lower.

When the chemical compound including a hydrogen atom exists in the gas for a plasma CVD process, the hydrogen atoms are captured in the film formed by the plasma CVD method. Because of the existence of the hydrogen atoms, for example, a dielectric constant of the film may be raised, reproducibly of the film-formation may be deteriorated, and/or a corrosion gas may be generated when the film is subjected to a heating process. When a semiconductor device is manufactured by using a film formed by a plasma CVD method as an interlayer insulation film, the semiconductor device having the interlayer insulation film may be subjected to several heating processes. Then, generation of the hydrogen fluoride may have a great effect on a semiconductor tip itself. Thus, if the amount of the chemical compound including a hydrogen atom in the gas for a plasma CVD process is controlled within the above range, a dielectric constant of the film may be decreased, reproducibly of the film-formation may be improved, and/or generation of the hydrogen fluoride, which has an adverse effect on the semiconductor tip, may be prevented.

Regarding the amount of the chemical compound including a hydrogen atom in the gas for a plasma CVD process, for example, the amount of an organic chemical compound including a hydrogen atom may be obtained by a gas chromatograph/mass spectro meter, and the amount of water may be obtained by a Karl Fischer moisture meter.

As a method of reducing the amount of the organic chemical compound including a hydrogen atom, a method of removing the organic chemical compound by means of an adsorbent, a method of reducing the amount by means of distillation, or a method of converting the organic chemical compound into another chemical compound that has a large boiling-point difference by a chemical reaction and then distilling, may be suitably selected. The method of removing the organic chemical compound by means of an adsorbent is preferable. Regarding the water (moisture), a method with an adsorbent is preferably used. As an adsorbent used in the method of reducing the amount of the organic chemical compound including a hydrogen atom, there are described zeolite, molecular sieves 3A, molecular sieves 4A, molecular sieves 5A, molecular sieves 13X, another zeolite, alumina, alumina gel, silica, silica gel, activated carbon, or the like, which has a molecular sieving effect. As the activated carbon, a botanical-series activated carbon made from charcoal, coconut-shell coal, palm-kernel coal or ash, or a coal-series activated carbon made from peat coal, lignite, brown coal, bituminous coal or anthracite coal may be suitably selected. As an adsorbent used in the method of reducing the amount of water, there are described molecular sieves 3A, molecular sieves 4A, molecular sieves 5A, molecular sieves 13X, or alumina which is often used as an adsorbent by a molecular sieving effect. The molecular sieves 13X is used preferably because the molecular sieves 13X is superior in removal performance and reduces the organic chemical compound including a hydrogen atom at the same time. These adsorbents are usually burned to be activated under an atmosphere of an inert gas such as a helium gas at the temperature of 100° C. or higher, preferably 200° C. or higher, more preferably 300° C., before usage thereof, in order to improve the ability of removing the chemical compound including a hydrogen atom. The burning time of the adsorbent is usually 5 hours or longer, preferably 10 hours or longer.

The amount of the usage of the adsorbent is preferably 5 to 100 parts by weight, more preferably 10 to 30 parts by weight, with respect to 100 parts by weight of the composition of the unsaturated carbon fluoride compound, and the chemical compound including a hydrogen atom to be treated. If the amount of the usage of the adsorbent is too small, the removal of the chemical compound including a hydrogen atom tends to be insufficient. If the amount of the usage of the adsorbent is too large, the manufacturing cost is high.

As a method of bringing the composition of the unsaturated carbon fluoride compound and the chemical compound including a hydrogen atom in contact with the above adsorbent, an immersing method wherein the adsorbent is immersed in a container filled with the composition of the unsaturated carbon fluoride compound and allowed to stand, a flowing method wherein the composition of the unsaturated carbon fluoride compound is caused to flow as a state of gas or liquid through a tube filled with the adsorbent for contact of the compound and the adsorbent, or any other method may be suitably selected, depending on characteristics of the composition of the unsaturated carbon fluoride compound.

Regarding a method of obtaining the composition of the unsaturated carbon fluoride compound and the chemical compound including a hydrogen atom, octafluorocyclopentene is explained as an example. As described in Japanese Patent Laid-Open Publication No. 9-95458, while 1,2-dichlorohexafluorocyclopentene is reacted with potassium fluoride in dimetylformamide under a flow of a nitrogen gas, the reaction product is extracted from a distillation column connected to the reacting container, so that the octafluorocyclopentene having purity of 99.8 to 99.98% may be obtained. The obtained octafluorocyclopentene is precisely distilled by another distillation column, which has many steps, so that the octafluorocyclopentene having moisture of about 30 weight ppm may be obtained.

In addition, octafluoro-2-pentyne may be manufactured by a known method or a method proposed by the inventors' patent application. According to the Japanese Patent Application 2001-342791 by the inventors, 2,3-dihydrodecafluoropentane and molten potassium hydroxide are brought in contact with each other, a generated gaseous chemical compound is captured in a cooled trap, the captured rough product is precisely distillated by a distillation column, so that the octafluoro-2-pentyne having purity of 99.9% or higher may be obtained. When the captured product is precisely distillated, the distillate is captured in a cooled trap, so that the octafluoro-2-pentyne having moisture of about 20 weight ppm may be obtained.

In addition, a minute amount of nitrogen gas and a minute amount of oxygen gas may exist in the gas for a plasma CVD process according to the present invention. The total amount of the nitrogen gas and the oxygen gas is preferably 30 volume ppm or lower with respect to the volume of the gas for a plasma CVD process.

The gas for a plasma CVD process according to the present invention is supplied to a container to conduct a plasma reaction for a semiconductor manufacturing step or the like. In addition, when the plasma reaction is conducted, the gas for a plasma CVD process according to the present invention is usually supplied into a plasma CVD apparatus together with an inert gas such as a helium gas, a neon gas, an argon gas, a xenon gas, or the like. The inert gas has an effect of diluting the gas for a plasma CVD process and an effect of changing plasma electron temperature and plasma electron density. Thus, by controlling balance of radicals and ions in the plasma reaction, suitable film-forming conditions can be obtained. The amount of the inert gas supplied into the plasma CVD apparatus is usually 2 to 100 mol, preferably 5 to 20 mol, with respect to 1 mol of the gas for a plasma CVD process according to the present invention.

The CVD process using the gas for a plasma CVD process of the present invention is a process wherein the unsaturated carbon fluoride compound is activated by plasma discharge to generate active species such as ions and radicals, so that a polymer film of fluorocarbon is formed on a surface of an object to be treated. Regarding the step of forming the polymer film, it is thought that various reactions such as polymerization reaction and/or ring-opening reaction of the unsaturated carbon fluoride compound are involved complicatedly together with the generation of the ion and radical species under an ionization condition, although it is not clear. The object to be treated is not limited, but may be an object to be used in a semiconductor manufacturing field, an electric and electronic field and a precise machinery field; or an object or a surface thereof requiring insulation properties, water repellency, corrosion resistance, acid resistance, lubricity, antireflection and/or the like from the point of view of functional properties. Especially, the CVD process is suitably used for forming an insulation film or an insulation material layer in a semiconductor-device manufacturing step, and for forming a protection film of an organic electroluminescence device. The concrete example is an interlayer insulation film on metal wirings made of aluminum, copper or tungsten, or a passivation film for protecting a tip. As the plasma CVD method, a method described in Japanese Patent Laid-Open Publication No. 9-237783 may be used. As a plasma generating condition, usually, a high-frequency electric power of 10 W to 10 kW to be applied to an upper electrode (showerhead) of a parallel-plate system, a temperature of the object to be treated of 0 to 500° C., and a pressure in a reaction chamber of 0.0133 Pa to 13.3 kPa are adopted. The thickness of the deposited film is usually 0.01 to 10 μm. The system used for the plasma CVD process is generally a parallel-plate CVD system, but may be a microwave CVD system, an ECR-CVD system, an inductively coupled plasma (ICP) CVD system and a high-density plasma CVD system (helicon type, high-frequency-inductive type).

Examples of the gas for a plasma CVD process are explained in detail as follows. The present invention is not limited to the examples. Herein, if another explanation is not added, "part", "%", and "ppm" in the examples and comparisons mean "part by weight", "weight %" and "weight ppm", respectively.

The analysis conditions of the following examples and comparisons are as follows.

<Analysis Condition 1: Gaschromatography Analysis (Abbreviated to "GC Analysis")>

Apparatus: HP6890 manufactured by Hewlett Packard Development Company

Column: Ultra Alloy$^+$–1(s)

(Length 50 m, inner diameter 0.25 mm, film thickness 1.5 μm)

Column Temperature: fixed at 80° C. for 10 minutes, then heated to 200° C. by the elapse of 20 minutes Injection Temperature: 200° C.

Carrier Gas: helium (at a flow rate of 1 ml/min)

Detector: FID

Inner Standard Material: n-butane

<Analysis Condition 2: Gaschromatography Mass Analysis (Abbreviated to "GC-MS Analysis")>

[Gaschromatography Part]

Apparatus: HP6890 manufactured by Hewlett Packard Development Company

Column: Frontier Lab Ultra Alloy$^+$–1(s)

(60 m×I. D 0.25 mm, 0.4 μmdf)

Column Temperature:–20° C.

Carrier Gas: helium

[Mass Analysis Part]

Apparatus: 5973 NETWORK manufactured by Hewlett Packard Development Company

Detector: EI type (acceleration electric voltage: 70 eV)

<Analysis Condition 3: Karl Fischer Moisture Analysis (Abbreviated to "KF Analysis")>

Apparatus: AQ-7 manufactured by HIRANUMA SANGYO Co., Ltd

Generating Liquid: HYDRANAL Aqualyte RS

Counter Electrode Liquid: Aqualyte CN

Detection Limitation: 0.5 ppm

Example 2

Potassium fluoride 30 parts and N,N-dimethylformamide 47 parts were supplied into a four-opening flask provided with a funnel, a distillation column, a thermometer and an agitating unit, under a flow of a nitrogen gas. A cooling medium of −20° C. was caused to flow into a Dimroth condenser provided at the top of the distillation column, and a distillate trap was provided on an atmosphere opening line of the distillation column, so that the inner temperature of the flask was raised to 135° C. by the elapse of 0.5 hours.

After the temperature in the flask reaches 135° C., 1,2-dichloro-3,3,4,4,5,5-hexafluorocyclopentene 50.2 parts was added dropwise from the funnel at a speed of 17.1 parts/hour, so that the reaction was started. After the elapse of 1.5 hours from the start of the reaction, it was confirmed that the temperature of a top portion of the distillation column was stabled at a boiling point (27° C.) of the product, and taking distillate was started. For 3 hours from the start of the distillation, the distillation speed was 0.105 parts/hour. Then, until the temperature of a top portion of the distillation column starts to gradually increase from 27° C. (till the elapse of 5 hours from the start of the distillation), the distillation speed was 0.105 parts/hour or lower. Thus, octafluorocyclopentene 38.24 parts was obtained. The yield was 87.8%, and the purity obtained by the GC analysis was 99.82%.

Then, the obtained octafluorocyclopentene 38.24 parts and some boiling tips were introduced into a glass round flask, and the flask was connected to a Sulzer-PACK distillation column with theoretical plate number 55 steps. A cooling water of 5° C. was circulated through the condenser at the top portion of the distillation column, the round flask was immersed in an oil bath and the reflux was maintained at 65° C. for one hour. Then, the distillate was taken at a reflux ratio of 40:1, and captured by a receiver. Thus, octafluorocyclopentene 34.5 parts was obtained. The yield was 90.2%, and the purity obtained by the GC analysis was 99.98%.

In addition, a molecular sieves 13X available in the market was burned at 350° C. for 12 hours under an atmosphere of a helium gas.

Then, the obtained octafluorocyclopentene 34.5 parts was introduced in a stainless-steel container, the above molecular sieves 13X 5.4 parts was added thereto, and they were left for one night. After that, the octafluorocyclopentene was transferred into a stainless-steel cylinder through a filter whose hole diameter is 0.05 μm. The cylinder was connected to a vacuum line via a valve, the cylinder was cooled by liquid nitrogen, a freeze-degassing process was conducted three times. Thus, a gas for a plasma CVD process was obtained. When the gas for a plasma CVD process in the cylinder was analyzed by the GC-MS analysis, no organic chemical compound having a hydrogen atom was detected (0 ppm). In addition, when the gas for a plasma CVD process in the cylinder was analyzed by the KF analysis, the moisture was lower than the detection limitation.

Example 3

Potassium hydroxide of pellet type (85%) 394 parts, available in the market, and 1,1,1,2,3,4,4,5,5,5-decafluoropentane (manufactured by Du Pont-Mitsui fluorochemical Co., Ltd) 300 parts were introduced in an autoclave made of hastelloy. The contents were sufficiently agitated, and they were reacted on each other at 200° C. for 7.5 hours. The autoclave was cooled, and connected to a trap for capture and a vacuum pump. Then, the vacuum pump was operated, so that the pressure in the autoclave was reduced, and hence the reaction mixture was discharged and captured by the trap that had been cooled by liquid nitrogen. The yield of the captured products was 182.5 parts. When the captured products were analyzed by the GC-analysis, octafluoro-2-pentyne, 1,1,1,2,4,5,5,5-nonafluoro-2-pentene (abbreviated to "reaction intermediate A"), 1,1,1,3,4,5,5,5-nonafluoro-2-pentene (abbreviated to "reaction intermediate B") and 1,1,1,2,3,4,4,5,5,5-decafluoropentane were included in the captured products. With respect to the introduced materials, the yield of the final object was 20.6%, and the total yield of the reaction intermediates A and B was 44.2%.

Then, the obtained captured products 182.5 parts (the octafluoro-2-pentine: 26.6%, and the total amount of the reaction intermediates A and B: 67.2%) was precisely distilled under a normal pressure by using a distillation column of KS type (with theoretical plate number 35 steps), manufactured by TOKA SEIKI Co., ltd. The temperature of a cooling medium at a top portion of the distillation column was maintained at −5° C. to −10° C. The temperature of the distillate trap was maintained at −78° C. By the precise distillation, 15.0 parts of the distillate of octafluoro-2-pentyne (boiling temperature: 5° C.) whose purity is 99.6%, 9.4 parts of the distillate of octafluoro-2-pentyne (boiling temperature: 5° C.) whose purity is 99.9%, and 89.5 parts of the distillate of reaction intermediates A and B (boiling temperature: 29° C.) whose purity is 99.8% were obtained.

Then, 15.0 parts of the obtained distillate of octafluoro-2-pentyne whose purity is 99.6% and 9.4 parts of the obtained distillate of octafluoro-2-pentyne whose purity is 99.9% were mixed, and again precisely distilled under a normal pressure by using the distillation column of KS type (with theoretical plate number 35 steps), manufactured by TOKA SEIKI Co., ltd. As a result, 13.0 parts of the distillate of octafluoro-2-pentyne (boiling temperature: 5° C.) whose purity is 99.99% was obtained.

In addition, a molecular sieves 13X available in the market was burned at 350° C. for 12 hours under an atmosphere of a helium gas.

Then, the obtained distillate of octafluoro-2-pentyne 13.0 parts (boiling temperature: 5° C.) were introduced in a stainless-steel container, the above molecular sieves 13X 2.6 parts was added thereto, and they were left for one night. After that, the octafluoro-2-pentyne was transferred into a stainless-steel cylinder through a filter whose hole diameter is 0.05 μm. The cylinder was connected to a vacuum line via a valve, the cylinder was cooled by liquid nitrogen, and a freeze-degassing process was conducted three times. Thus, a gas for a plasma CVD process was obtained. When the gas for a plasma CVD process in the cylinder was analyzed by the GC-MS analysis, no organic chemical compound having a hydrogen atom was detected (0 ppm). In addition, when the gas for a plasma CVD process in the cylinder was analyzed by the KF analysis, the moisture was lower than the detection limitation.

(Comparison 2)

Instead of using the 5.4 parts of the molecular sieves 13X that had been burned at 350° C. for 12 hours under an atmosphere of a helium gas, 2.7 parts of a molecular sieves 13X available in the market was used as it was. Except for that, the same conditions as the example 2 were adopted, so that a gas for a plasma CVD process was obtained in the stainless-steel cylinder. When the gas for a plasma CVD process in the cylinder was analyzed by the GC-MS analysis, the total amount of organic chemical compounds having a hydrogen atom was 150 ppm with respect to the weight of the gas for a plasma CVD process. In addition, when the gas for a plasma CVD process in the cylinder was analyzed by the KF analysis, the moisture was 5 ppm with respect to the weight of the gas for a plasma CVD process.

(Comparison 3)

Instead of using the 2.6 parts of the molecular sieves 13X that had been burned at 350° C. for 12 hours under an atmosphere of a helium gas, 2.6 parts of an unprocessed molecular sieves 13X was used. Except for that, the same conditions as the example 2 were adopted, so that a gas for a plasma CVD process was obtained in the stainless-steel cylinder. When the gas for a plasma CVD process in the cylinder was analyzed by the GC-MS analysis, the following organic chemical compounds having a hydrogen atom were found therein; monofluoroacetylene of 20.5%, pentafluoroethane of 3.5%, 1,1-dihydrotetrafluoropropene of 20%, and 3,3,3-trifluoropropyne of 56%. The total amount of them was 130 ppm with respect to the weight of the gas for a plasma CVD process. In addition, when the gas for a plasma CVD process in the cylinder was analyzed by the KF analysis, the moisture was 6 ppm with respect to the weight of the gas for a plasma CVD process.

Example 4

A film was formed by a plasma CVD process using the gas for a plasma CVD process manufactured according to the example 2.

A silicon oxide film wafer on which aluminum has been partially vapor-deposited was used as a substrate. A parallel-plate type of plasma CVD apparatus was used as the plasma CVD apparatus. The gas for a plasma CVD process manufactured according to the example 2 was used. Then, a plasma CVD process for forming an insulation film was conducted under the following conditions; a flow rate of the gas for a plasma CVD process: 40 sccm, a flow rate of the argon gas: 400 sccm, a pressure: 250 mTorr, an RF output (frequency: 13.56 MHz): 400 W, and a temperature of the substrate: 260° C.

A film having a thickness of 0.5 μm was obtained on the substrate by the above process under the above conditions. No void was generated in the film, and the film was dense and uniform. Adhesion of the film to the substrate was also good. The dielectric constant of the film was 2.2. When the silicon wafer on which the film had been formed was placed in a vacuum container and subjected to a heating process of 400° C. under a reduced pressure, generation of hydrogen fluoride was not found.

Example 5

The gas for a plasma CVD process manufactured according to the example 3 was used instead of the gas for a plasma CVD process manufactured according to the example 2. Except for that, the same experiment as the example 4 was conducted so that a film having a thickness of 0.4 μm was obtained on the substrate. No void was generated in the film, and the film was dense and uniform. Adhesion of the film to the substrate was also good. The dielectric constant of the film was 1.8. When the silicon wafer on which the film had been formed was placed in a vacuum container and subjected to a heating process of 400° C. under a reduced pressure, generation of hydrogen fluoride was not found.

(Comparison 4)

The gas for a plasma CVD process manufactured according to the comparison 2 was used instead of the gas for a plasma CVD process manufactured according to the example 2. Except for that, the same experiment as the example 4 was conducted so that a film having a thickness of 0.5 μm was obtained on the substrate. No void was generated in the film, and the film was dense and uniform. Adhesion of the film to the substrate was also good. The dielectric constant of the film was 2.4. However, when the silicon wafer on which the film had been formed was placed in a vacuum container and subjected to a heating process of 400° C. under a reduced pressure, generation of hydrogen fluoride was found by the GC-MS analysis.

(Comparison 5)

The gas for a plasma CVD process manufactured according to the comparison 2 was used instead of the gas for a plasma CVD process manufactured according to the example 3. Except for that, the same experiment as the example 3 was conducted so that a film having a thickness of 0.4 μm was obtained on the substrate. No void was generated in the film, and the film was dense and uniform. Adhesion of the film to the substrate was also good. The dielectric constant of the film was 2.0. However, when the silicon wafer on which the film had been formed was placed in a vacuum container and subjected to a heating process of 400° C. under a reduced pressure, generation of hydrogen fluoride was found by the GC-MS analysis.

The results of the examples 4-5 and the comparisons 4-5 are shown in Table 1. It can be found from Table 1 that the gas for a plasma CVD process containing the unsaturated carbon fluoride and the chemical compound including a hydrogen atom, the amount of the chemical compound including a hydrogen atom being 90 weight ppm or less, can be obtained by the manufacturing method of the present invention. In addition, in the example 4 or 5 wherein the gas for a plasma CVD process of the present invention was used, the dielectric constant of the film formed by the CVD process was reduced, and generation of the hydrogen fluoride, which is a corrosion gas, was restrained.

TABLE 1

| | CARBON FLUORIDE COMPOUND | AMOUNT OF ORGANIC CHEMICAL COMPOUND INCLUDING HYDROGEN ATOM | MOISTURE | AMOUNT OF CHEMICAL COMPOUND INCLUDING HYDROGEN ATOM | DIELECTRIC CONSTANT | GENERATION OF HF GAS |
|---|---|---|---|---|---|---|
| EXAMPLE 4 | OCTAFLUORO-CYCLO PENTENE | 0 ppm | 0.5 ppm or LESS | 0.5 ppm or LESS | 2.2 | NOT FOUND |
| EXAMPLE 5 | OCTAFLUORO-2-PENTYNE | 0 ppm | 0.5 ppm or LESS | 0.5 ppm or LESS | 1.8 | NOT FOUND |
| COMPARISON 4 | OCTAFLUORO-CYCLO PENTENE | 160 ppm | 5 ppm | 155 ppm | 2.4 | FOUND |
| COMPARISON 5 | OCTAFLUORO-2-PENTYNE | 130 ppm | 6 ppm | 138 ppm | 2.0 | FOUND |

(NOTE)
DETECTION LIMITATION OF MOISTURE: 0.5 ppm

The invention claimed is:

1. A manufacturing method of a semiconductor device comprising the steps of:
    generating a plasma of a source gas consisting of a chemical compound of carbon and fluorine and including hydrogen atoms of $1 \times 10^{-3}$ atomic % or less, and
    forming an insulating film consisting of a fluoridation carbon film that includes hydrogen atoms of not more than 3 atomic % and more than 0 atomic %, on a substrate, by using the plasma of the source gas, the hydrogen atoms resulting from a chemical compound including hydrogen atoms as impurities.

2. A manufacturing method according to claim 1, wherein the insulating film is an interlayer insulation film.

3. A manufacturing method according to claim 1, wherein the ratio of fluorine against carbon in the fluoridation carbon film is 0.1 to 1.5.

4. A manufacturing method of a semiconductor device according to claim 1, further comprising: heating the substrate at a temperature of 420° C. or lower, after the step of forming the insulating film.

5. A manufacturing method of a semiconductor device according to claim 1 or 4, wherein the chemical compound of carbon and fluorine is $C_5F_8$.

* * * * *

UNITED STATES PATENT AND TRADEMARK OFFICE
CERTIFICATE OF CORRECTION

PATENT NO. : 7,704,893 B2
APPLICATION NO. : 10/568461
DATED : April 27, 2010
INVENTOR(S) : Yasuo Kobayashi et al.

It is certified that error appears in the above-identified patent and that said Letters Patent is hereby corrected as shown below:

Title Page

Item [73], Assignees, change    "Tokyo Eectron Limited, Tokyo (JP)
Tadahiro Ohmi, Miyagi-Ken (JP)
Zeon Corporation, Tokyo (JP)"

To

--Tokyo Electron Limited, Tokyo (JP)
Tadahiro Ohmi, Miyagi-Ken (JP)
Zeon Corporation, Tokyo-To (JP)--

Signed and Sealed this
Eighteenth Day of January, 2011

David J. Kappos
*Director of the United States Patent and Trademark Office*